United States Patent
Fomenko et al.

(10) Patent No.: US 10,027,106 B2
(45) Date of Patent: Jul. 17, 2018

(54) POWER SUPPLY UNIT FOR THE PROVISION OF AT LEAST ONE SWITCHABLE POWER OUTPUT

(71) Applicant: PHOENIX CONTACT GMBH & CO. KG, Blomberg (DE)

(72) Inventors: Alexander Fomenko, Bielefeld (DE); Gerhard Wolk, Schieder-Schwalenberg (DE)

(73) Assignee: PHOENIX CONTACT GMBH & CO. KG (DE)

( * ) Notice: Subject to any disclaimer, the term of this patent is extended or adjusted under 35 U.S.C. 154(b) by 0 days.

(21) Appl. No.: 15/723,318

(22) Filed: Oct. 3, 2017

(65) Prior Publication Data
US 2018/0115147 A1  Apr. 26, 2018

(51) Int. Cl.
*H02H 3/08* (2006.01)
*H02H 3/087* (2006.01)
(Continued)

(52) U.S. Cl.
CPC ........... *H02H 3/0935* (2013.01); *G01R 31/02* (2013.01); *H02H 1/0007* (2013.01); *H02H 3/06* (2013.01); *H02H 11/008* (2013.01)

(58) Field of Classification Search
CPC .......... H02H 3/08; H02H 3/087; H02H 3/093; H02H 7/18
(Continued)

(56) References Cited

U.S. PATENT DOCUMENTS 6,339,526 B1 * 1/2002 Aboyoussef ............. H02H 3/24
 327/527
2010/0328828 A1 12/2010 Xu
 (Continued)

FOREIGN PATENT DOCUMENTS

DE  102012103551  10/2013
DE  102013105942  12/2014

OTHER PUBLICATIONS

Official Action for German Patent Application No. 102016120099.9, dated Aug. 3, 2017, 4 pages.

*Primary Examiner* — Dharti Patel
(74) *Attorney, Agent, or Firm* — Sheridan Ross P.C.

(57) ABSTRACT

The invention relates to a power supply unit for the provision of at least one switchable power output, having
  at least one power input $U_{IN}$,
  at least one voltage measuring device that monitors the voltage at the at least one power input $U_{IN}$,
  wherein, if the input voltage falls below a defined threshold $U_{thres}$ or if the change in the input voltage $U_{IN}$ per unit of time rises above a defined threshold $\Delta U_{thres}/\Delta t$, the power output/power outputs is/are switched off and the input voltage is then measured at a first timepoint $t_1$, and, after a first predetermined time ($t_{d1}$) (S240), the input voltage U is measured again at a second timepoint $t_2$, and if the input voltage at the second timepoint is greater than the input voltage at the first timepoint, it is assumed that a short circuit is present at at least one power output.

7 Claims, 5 Drawing Sheets

(51) Int. Cl.
    *H02H 3/093*     (2006.01)
    *H02H 7/18*     (2006.01)
    *H02H 3/06*     (2006.01)
    *H02H 1/00*     (2006.01)
    *H02H 11/00*     (2006.01)
    *G01R 31/02*     (2006.01)

(58) Field of Classification Search
    USPC .......................................................... 361/87
    See application file for complete search history.

(56) References Cited

U.S. PATENT DOCUMENTS

| | | | |
|---|---|---|---|
| 2011/0299201 A1* | 12/2011 | Rozman | H02H 1/0015 361/42 |
| 2012/0063045 A1* | 3/2012 | Shearon | H02H 1/04 361/65 |
| 2014/0347774 A1 | 11/2014 | Uehara | |
| 2016/0344177 A1* | 11/2016 | Wang | H02H 3/335 |
| 2017/0331270 A1* | 11/2017 | Mattos | G01R 17/02 |

* cited by examiner

POWER SUPPLY UNIT FOR THE PROVISION OF AT LEAST ONE SWITCHABLE POWER OUTPUT

CROSS-REFERENCE TO RELATED APPLICATION

This application claims the benefit of German Patent Application No. DE 2016 120 099.9 filed Oct. 21, 2016, the entire disclosure of which is incorporation herein by reference.

FIELD

The invention relates to a power supply unit for the provision of at least one switchable power output

BACKGROUND

Numerous power supply units are known from the prior art.

One difficulty that arises in this context is distinguishing true short circuits from virtual short circuits. Virtual short circuits arise as a result of capacitative loads, which behave like a short circuit, particularly at switch-on. That is, until the capacitative load is appropriately charged, substantial currents can be flowing.

It is for this reason that repeated attempts have been made in the past to identify these virtual short circuits.

For example, an electronic protection device is known from DE 10 2012 103 551 A1 that switches off a controller-controlled switch in dependence on an (output-side) overcurrent and switches it back on again in dependence on the change in voltage at the output. A device that is similar to this is known from DE 10 2013 105 942 A1.

However, the construction of these devices is complicated. In particular, they require an (output-side) current measurement on the basis of which it is decided whether a hazardous state of a true short circuit is present.

It can also be that the supply network cannot supply the current or short-circuit current required for such a detection. Such conditions can occur, for example, when the supply network is already under a heavy load or has a faulty design (e.g., is not powerful enough).

In addition, in the case of weak network components, the voltage can break down dramatically in the event of a short circuit. This can have the effect, for example, that the board supply for the controller (for identifying short circuits and/or controlling the switch) also breaks down, thus rendering the controller unable to respond in the event of a short circuit.

It is therefore the object of the invention to provide an improved and cost-effective power supply unit for the provision of at least one switchable power output that avoids one or more of the drawbacks of the prior art.

SUMMARY

The object is achieved according to the invention by the features of the independent claims. Advantageous embodiments of the invention are indicated in the subclaims.

BRIEF DESCRIPTION OF THE DRAWINGS

In the following, the invention is explained in further detail with reference to the enclosed drawing on the basis of preferred embodiments.

DETAILED DESCRIPTION

Figure 1:
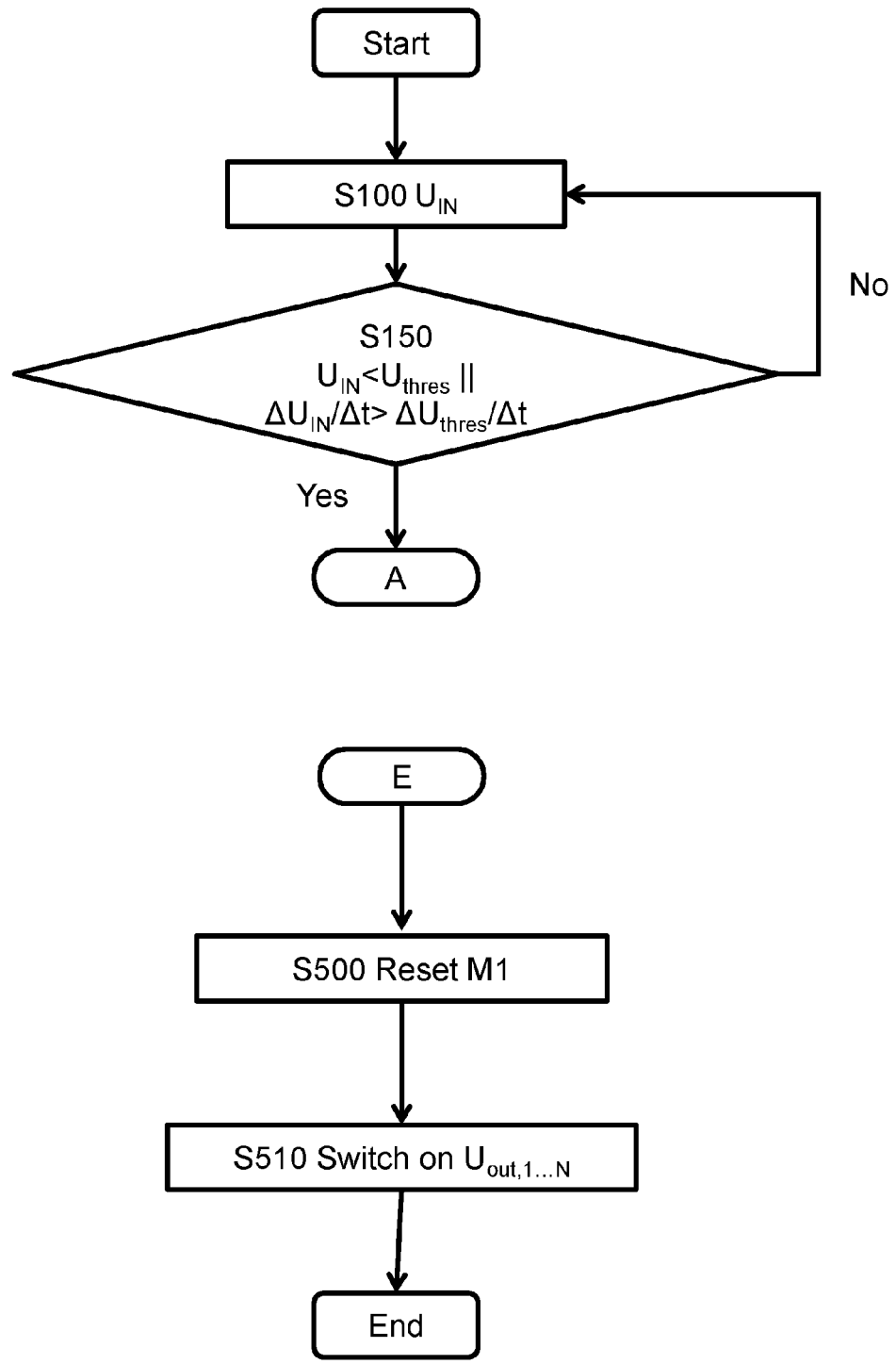
FIG. 1 shows a flowchart of embodiments of the invention.
Figure 1:
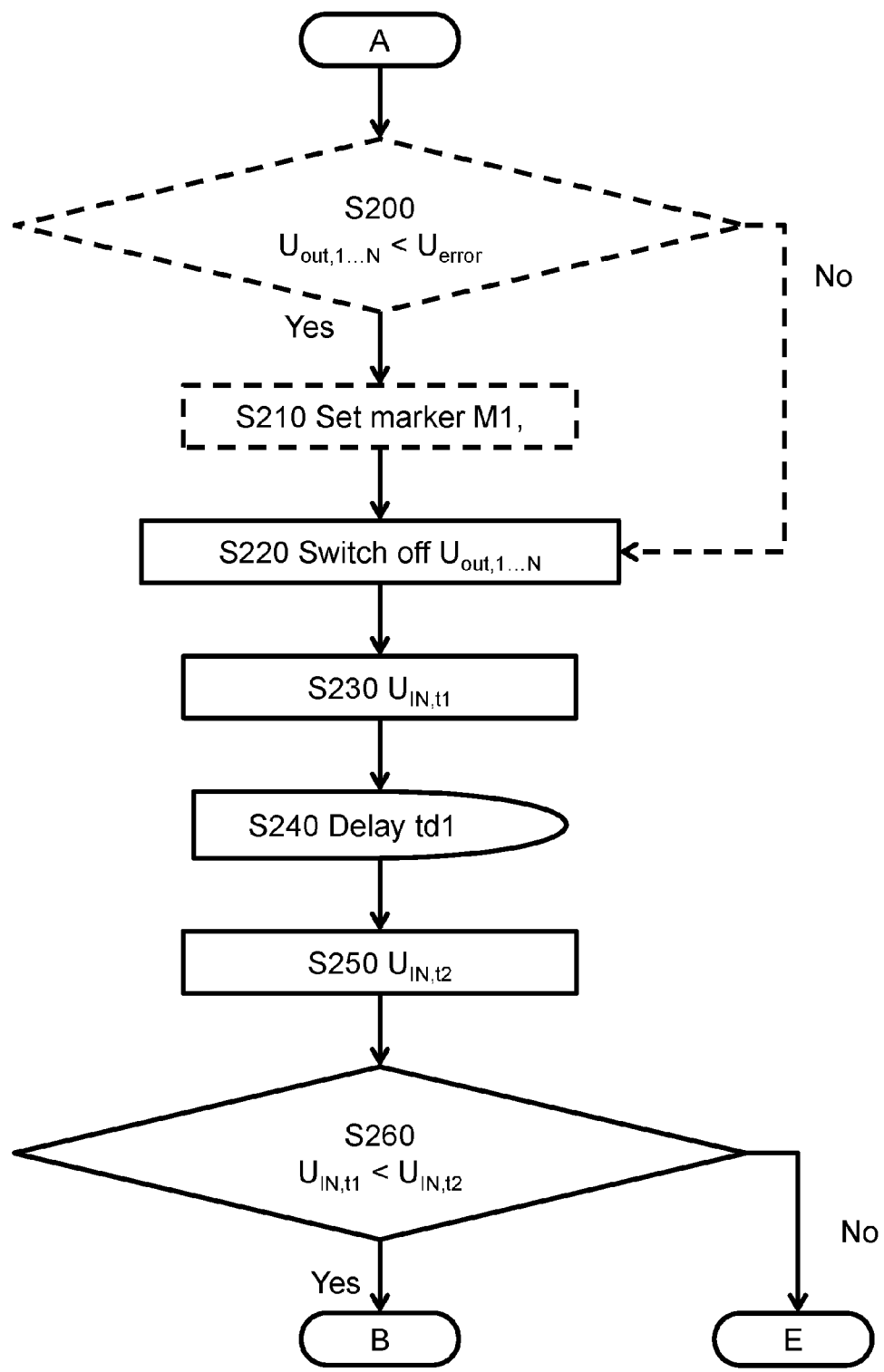
Figure 1:
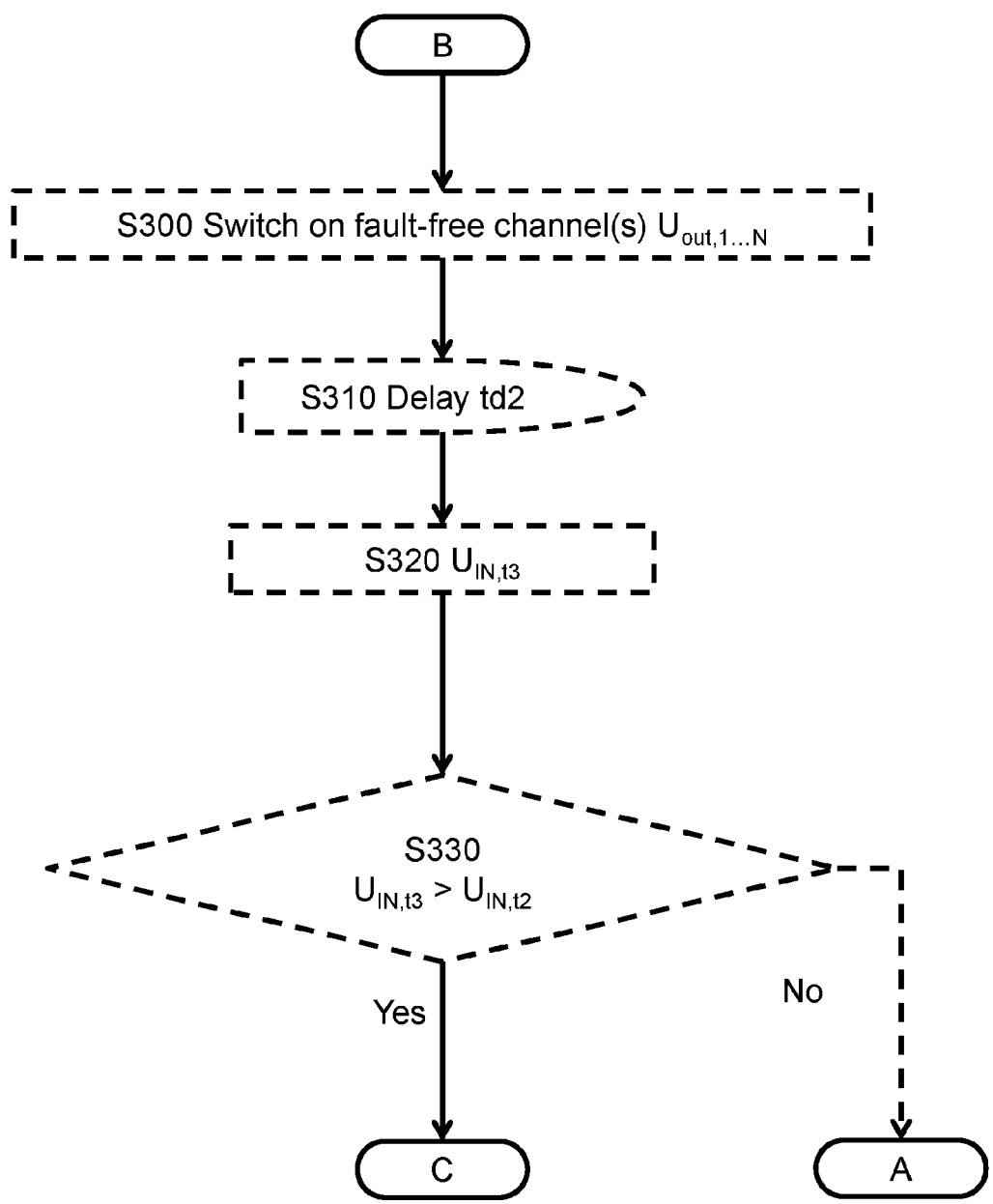
Figure 1:
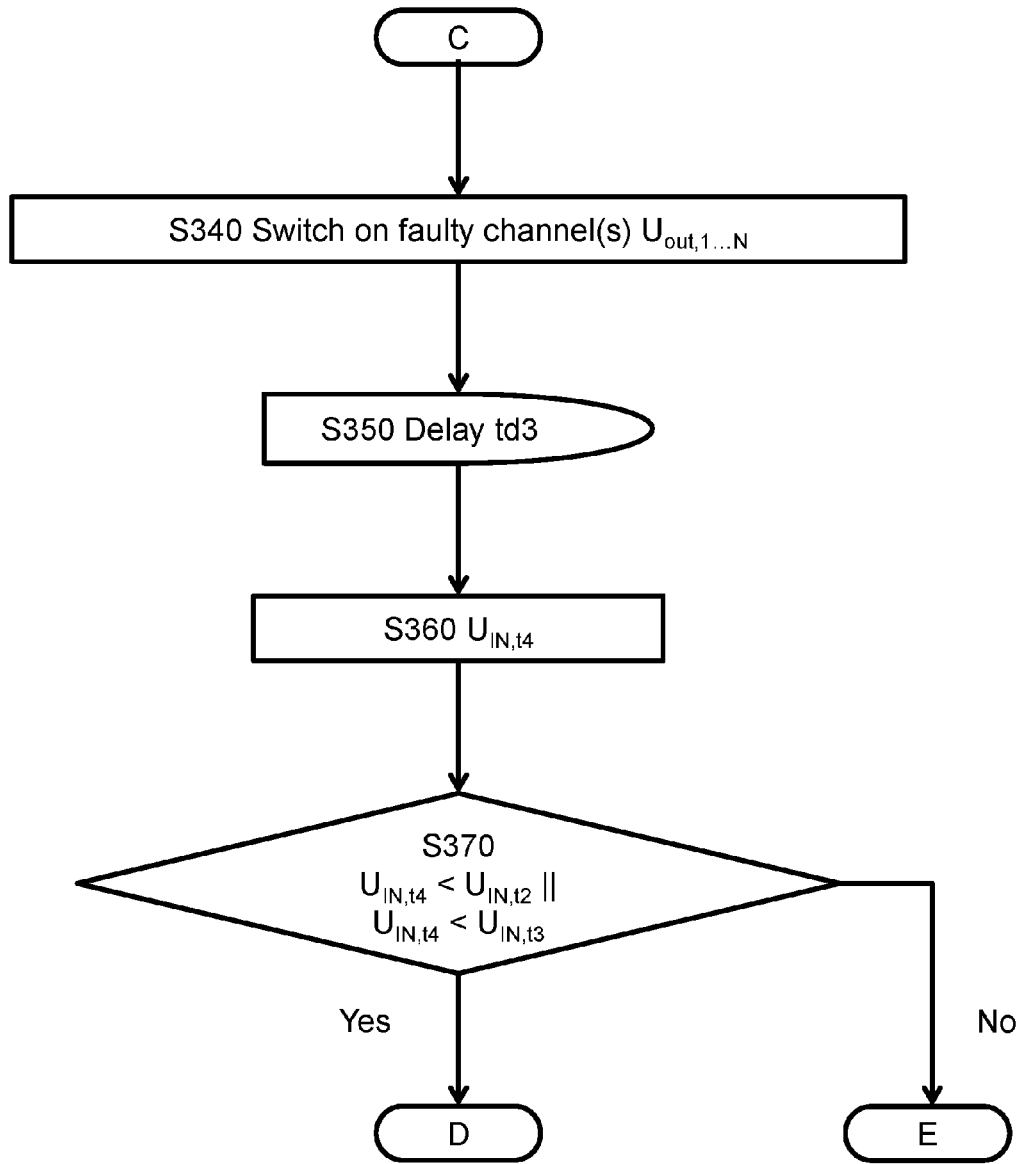
Figure 1:
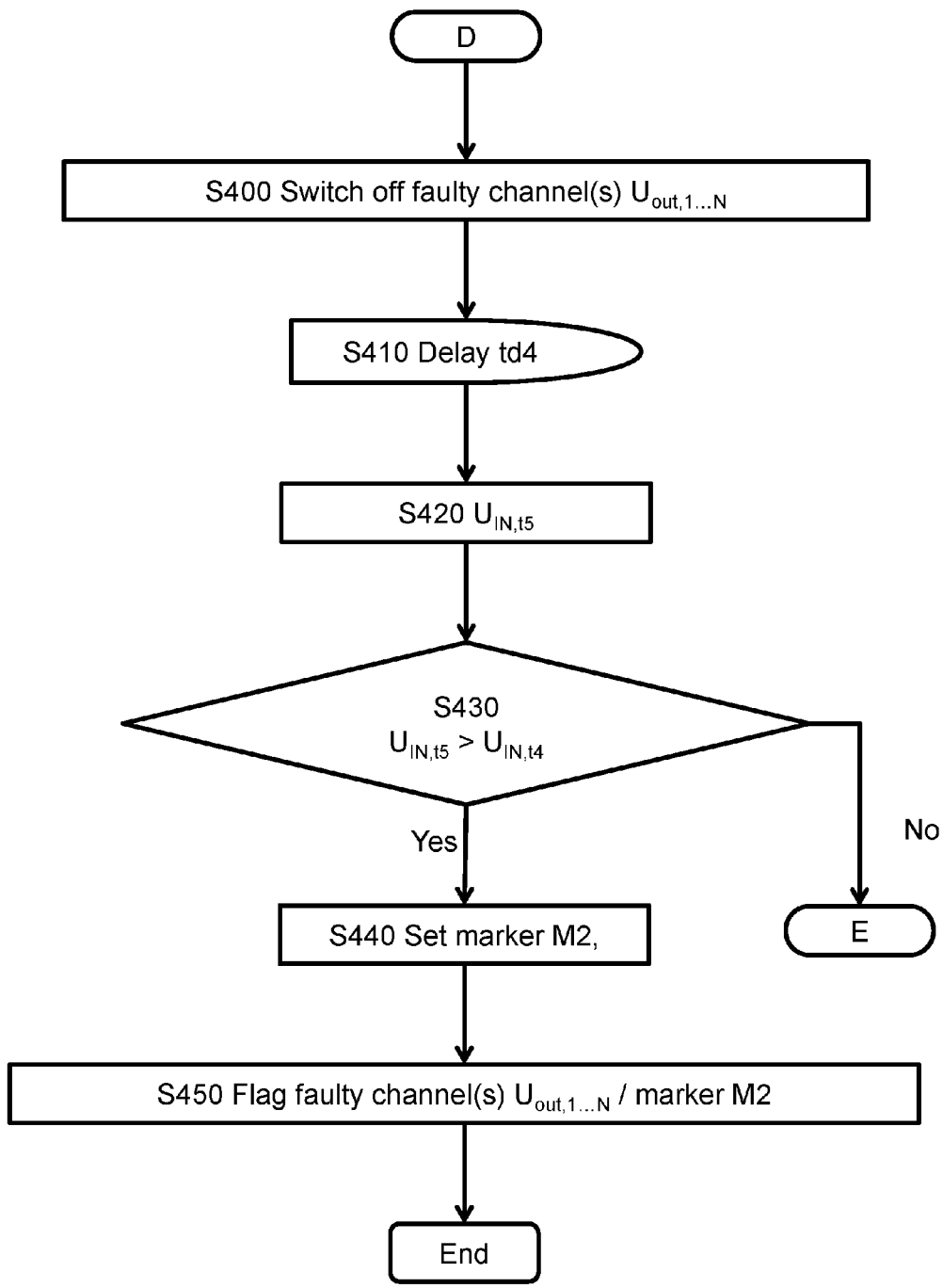

The invention is explained in further detail below with reference to the FIGURE. It should be noted that different aspects are described, each of which can be utilized individually or in combination. That is, any aspect can be used with different embodiments of the invention, provided that it is not portrayed explicitly as a mere alternative.

Moreover, for the sake of simplicity, reference will generally be made in the following to only one entity. Insofar as not noted explicitly, however, the invention can also have several of the entities concerned. Therefore, the use of the words "a," "an," "of a" and "of an" is to be understood only as an indication to the effect that at least one entity is used in a single embodiment.

Due to the size of the flowchart, which shows different aspects of embodiments, it has been distributed over several pages, with the interfaces being identified clearly by A, B, C, D, and E.

Where individual steps are indicated—with broken lines, for example—these steps are to be understood in relation to embodiments with two or more power outputs $U_{out1}$, $U_{out2}$, ..., $U_{outN}$. The case of a single power output corresponds to N=1.

The method described below relates to the intelligent identification and reliable switching-off of the hazardous conditions—short circuits, for example, or inadmissibly high currents in the supply networks (particularly DC supply networks)—by means of a circuit breaker.

In the method according to the invention, the problem is resolved through the initiation of a special evaluation of the network conditions in the event of an excessively strong decline in the input voltage. No current measurement is required at any point in time.

A power supply unit according to the invention is suitable for the provision of at least one switchable power output $U_{out1}$, $U_{out2}$, ..., $U_{outN}$, where N is a natural number.

The power supply unit according to the invention has at least one power input $U_{IN}$ and at least one voltage measuring device that monitors the voltage at the at least one power input $U_{IN}$.

The input voltage $U_{IN}$ (or the change in the input voltage over a predetermined period of time) is measured in a first step S100.

When the input voltage $U_{IN}$ falls below a defined threshold $U_{thres}$, or when the change in the input voltage $U_{IN}$ per unit of time rises above a defined threshold $\Delta U_{thres}/\Delta t$, it is decided in step S150 that an additional inquiry is required. It should be noted that the threshold value $U_{thres}$ and the threshold value $\Delta U_{thres}/\Delta t$ can be selected independently of one another.

For example, in a step S220, the power output or power outputs $U_{out1}$, $U_{out2}$, $U_{outN}$ can be switched off, and the input voltage $U_{IN,t1}$ is then measured at a first timepoint $t_1$ in a step S230, and after a predetermined time $t_{d1}$—e.g., 2.5 ms— (delay step S240), the input voltage $U_{IN,t2}$ is measured again at a second timepoint $t_2$ in a step S250. If the input voltage $U_{IN,t2}$ is greater at the second timepoint $t_2$ than the input voltage $U_{IN,t1}$ at the first timepoint $t_1$, it is assumed in step S260 that a short circuit is present at at least one power output. If the input voltage has not increased, the voltage drop was not caused by a short circuit, and the detection is abandoned. Delay step S240 should therefore be of sufficient length as to enable the input voltage to be obtained under regular conditions.

In another embodiment of the invention, following the assumption in step S260 that a short circuit is present at at least one power output, the power output or power outputs $U_{out1}, U_{out2}, \ldots, U_{outN}$ that is/are assumed to be faulty is/are switched on in step S340 and, after a third predetermined time $t_{d3}$—e.g., 0.5 ms—(delay step S350), the input voltage $U_{IN,t4}$ is subsequently measured again at a fourth timepoint $t_4$ in a step S360, and if the input voltage at the fourth timepoint $t_4$ is lower than the previously measured input voltage ($t_2$; $t_3$), it is assumed to be confirmed in step S370 that a short circuit is present at at least the power output or power outputs that was/were assumed to be faulty. It should be pointed out here that the previously measured input voltage is generally an input voltage that was measured immediately beforehand. In the following, in the event of several power outputs $U_{out1}, U_{out2}, \ldots, U_{outN}$, it can turn out, for example, that an additional measurement can be interposed. If the input voltage has remained the same or risen, the detection is abandoned, since the cause does not lie in a short circuit at the output. If the input voltage has dropped, then the power output or power outputs assumed to be faulty is/are switched off again.

In another embodiment of the invention, following the confirmed assumption in step S370 that a short circuit is present at at least the power output or power outputs that is/are assumed to be faulty, the power output or power outputs assumed to be faulty are switched off in step S400 and, after a fourth predetermined time $t_{d4}$—e.g., 0.5 ms— (delay step S410), the input voltage $U_{IN,t5}$ is subsequently measured again at a fifth timepoint is in a step S420, and if the input voltage at the fifth timepoint $t_5$ is greater than the input voltage $U_{IN,t4}$ measured at the fourth timepoint $t_4$, it is decided in step S430 that a short circuit is present at at least the power output or power outputs assumed to be faulty. If the input voltage has remained the same or dropped, the detection is abandoned, since the cause does not lie in a short circuit at the output. If the input voltage has risen, then the power output or power outputs assumed to be faulty is/are switched off and flagged as a short circuit.

In another embodiment of the invention, a power output that is identified as being faulty is flagged locally or by means of a remote signal in step S450. For this purpose, a suitable local display (by means of light indicators or electronic paper displays or the like, for example) and/or an acoustic signal (by means of a buzzer or the like, for example), or a remote signal (by means of a remote contact, for example) can be provided as a closer or opener and/or a data interface.

In another embodiment of the invention, which will be described below, the power supply unit makes a plurality of power outputs available.

In this case, it can be advantageous to identify an assumed faulty power output. It is possible, in principle, to identify a faulty power output or faulty power outputs through a single query in a sequential or random order. However, an inference regarding an assumed faulty power output or several assumed faulty power outputs can also be made by observing the respective output voltages. For this purpose, following the detection in step S150 of the fact that the input voltage has fallen below a defined threshold $U_{thres}$ or that the change in the input voltage $U_{IN}$ per unit of time has risen above a defined threshold $\Delta U_{thres}/\Delta t$, an assumed faulty power output is expediently identified at least on the basis of the respective output voltage in step S200.

A wide variety of techniques can be used for this purpose. For example, the absolute value of the respective output voltage can be observed, so that the lowest absolute value of a power output can be evaluated as an indicator, for example. Alternatively or in addition, a relation can be established between a respective measured output voltage of a power output with an intended output voltage and used as an (additional) indicator. Likewise, the input voltage can also be taken into account, with the input voltage $U_{IN}$ minus a measured output voltage $U_{ERR}$, for example, being set in relation to a certain threshold value.

An assumed faulty power output or faulty power outputs can be determined from this and noted in a step S210 in a marker M1, for example in a memory array. Advantageously, the memory array should have at least N binary memory cells, so that each one of the N power outputs can be stored as faulty/fault-free.

In another embodiment of the invention, which will be described below, the power supply unit again makes a plurality of power outputs available.

Following the assumption in step S260 that a short circuit is present at at least one power output, the power output or power outputs assumed to be fault-free are switched on and, after a second predetermined time $t_{d2}$—e.g., 0.5 ms—(delay step S310), the input voltage $U_{IN,t3}$ is subsequently measured again at a third timepoint $t_3$ in step S320, and if the input voltage at the third timepoint is greater than the input voltage $U_{IN,t2}$ measured at the second timepoint $t_2$, the assumption is confirmed in step S330 that a short circuit is present at at least the power output or power outputs assumed to be faulty. If the input voltage drops again, at least one other power output is impacted by a fault, and the search for a faulty power output is continued/repeated. If the input voltage remains unchanged or continues to rise, the faulty power output or faulty power outputs are switched on again.

In another embodiment of the invention, a provision is made that, in the event that an assumption cannot be confirmed, the relevant power output is put back into operation as non-faulty in step S500. In this way, it can be achieved that fluctuations on the input side such as those which can be caused by overvoltage events, switching events acting back upon the supply network, etc., [do not] result in an erroneous shutdown. This increases the availability of the respective output voltages.

In other words, it can be reliably ascertained even in rather weakly designed power supplies whether a problem is a result of a weak design or a true short circuit. This means, in particular, that a current measurement can be dispensed with. That is, with the methods that have been presented in the foregoing, a short circuit is reliably detected even if the rated current setting of a device circuit breaker was set too high.

What is claimed is:

1. A power supply unit for the provision of at least one switchable power output, having
at least one power input $U_{IN}$,
at least one voltage measuring device that monitors the voltage at the at least one power input $U_{IN}$,
wherein, if the input voltage falls below a defined threshold $U_{thres}$ or if the change in the input voltage $U_{IN}$ per unit of time rises above a defined threshold $\Delta U_{thres}/\Delta t$, the power output/power outputs is/are switched off and the input voltage is then measured at a first timepoint $t_1$, and, after a first predetermined time, the input voltage U is measured again at a second timepoint $t_2$, and if the input voltage at the second timepoint is greater than the input voltage at the first timepoint, it is assumed that a short circuit is present at at least one power output.

2. The power supply unit as set forth in claim 1, wherein, following the assumption that a short circuit is present at at least one power output, the power output or power outputs that is/are assumed to be faulty is/are switched on, and, after a third predetermined time, the input voltage is subsequently measured again at a fourth timepoint, and if the input voltage at the fourth timepoint is lower than the previously measured input voltage, the assumption is confirmed that a short circuit is present at at least the power output or power outputs that was/were assumed to be faulty.

3. The power supply unit as set forth in claim 2, wherein, following the confirmed assumption that a short circuit is present at at least the power output or power outputs that is/are assumed to be faulty, the power output or power outputs assumed to be faulty are switched off, and, after a fourth predetermined time, the input voltage is subsequently measured again at a fifth timepoint, and if the input voltage at the fifth timepoint is greater than the input voltage measured at the fourth timepoint, it is decided that a short circuit is present at at least the power output or power outputs assumed to be faulty.

4. The power supply unit as set forth in claim 3, wherein a power output is flagged as having been identified as faulty.

5. The power supply unit as set forth in claim 1, wherein the power supply unit makes a plurality of power outputs available, and, following the detection of the fact that the input voltage has fallen below a defined threshold or that the change in the input voltage ($U_{IN}$) per unit of time has risen above a defined threshold, an assumed faulty power output is identified at least on the basis of the respective output voltage.

6. The power supply unit as set forth in claim 1, wherein the power supply unit makes a plurality of power outputs available, and, following the assumption that a short circuit is present at at least one power output, the power output or power outputs assumed to be faulty are switched on, and, after a second predetermined time, the input voltage ($U_{IN,t3}$) is subsequently measured again at a third timepoint, and if the input voltage at the third timepoint is greater than the input voltage measured at the second timepoint, the assumption that a short circuit is present at at least the power output or power outputs assumed to be faulty is reinforced.

7. The power supply unit as set forth in claim 1, wherein, in the event that an assumption cannot be confirmed, the relevant power output is put back into operation as non-faulty.

* * * * *